US009633149B2

(12) United States Patent
Yen et al.

(10) Patent No.: US 9,633,149 B2
(45) Date of Patent: Apr. 25, 2017

(54) SYSTEM AND METHOD FOR MODELING THROUGH SILICON VIA

(75) Inventors: Hsiao-Tsung Yen, Tainan (TW); Yu-Ling Lin, Taipei (TW); Chin-Wei Kuo, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/419,959

(22) Filed: Mar. 14, 2012

(65) Prior Publication Data

US 2013/0246990 A1    Sep. 19, 2013

(51) Int. Cl.
    G06F 9/455     (2006.01)
    G06F 17/50    (2006.01)
    H01L 23/498   (2006.01)
(52) U.S. Cl.
    CPC .... *G06F 17/5036* (2013.01); *H01L 23/49827* (2013.01); *H01L 2224/13* (2013.01); *H01L 2224/16225* (2013.01); *H01L 2924/15311* (2013.01)
(58) Field of Classification Search
    CPC ....... G06F 17/5036; H01L 2224/16225; H01L 2924/15311; H01L 2224/13; H01L 23/49827
    See application file for complete search history.

(56) References Cited

U.S. PATENT DOCUMENTS

| 6,725,185 | B2 | 4/2004 | Clement |
| 8,103,996 | B2* | 1/2012 | Kariat et al. ................... 716/100 |
| 8,146,032 | B2* | 3/2012 | Chen et al. ................... 716/106 |
| 8,234,606 | B2* | 7/2012 | Collins et al. ................ 716/102 |
| 8,607,179 | B2* | 12/2013 | Wu et al. ....................... 716/115 |
| 2001/0029601 | A1 | 10/2001 | Kimura et al. |
| 2009/0319965 | A1 | 12/2009 | Kariat et al. |
| 2010/0199236 | A1 | 8/2010 | Chen et al. |
| 2013/0007692 | A1* | 1/2013 | Yeh et al. ..................... 716/136 |
| 2013/0139121 | A1* | 5/2013 | Wu et al. ...................... 716/113 |

OTHER PUBLICATIONS

Yoon, K., et al., "Modeling and Analysis of Coupling between TSVs, Metal, and RDL interconnects in TSV-based 3D IC with Silicon Interposer", 2009 11th Electronics Packaging Technology Conference, pp. 702-706.

(Continued)

*Primary Examiner* — Nha Nguyen
(74) *Attorney, Agent, or Firm* — Duane Morris LLP

(57) ABSTRACT

A computer implemented system comprises a processor programmed to analyze a circuit to determine a response of the circuit to an input radio frequency (RF) signal, for at least one of designing, manufacturing, and testing the circuit. An interposer model is tangibly embodied in a non-transitory machine readable storage medium to be accessed by the processor. The interposer model is processed by the computer to output data representing a response of a though substrate via (TSV) to the radio frequency (RF) signal. The interposer model comprises a plurality of TSV models. Each TSV model has a respective three-port network. One of the ports of each three-port network is a floating node. The floating nodes of each of the three-port networks are connected to each other.

18 Claims, 10 Drawing Sheets

(56) References Cited

OTHER PUBLICATIONS

Bermond, C., et al., "High Frequency Characterization and Modeling of High Density TSV in 3D Integrated Circuits", 2009 IEEE.
Web Brochure entitled "Virtuoso Multi-Mode Simulation", www.cadence.com, 2011.
Web Brochure entitled Agilent EEsof EDA, W2200 ADS Core:, www.agilent.com/find/eesof-ads, Apr. 15, 2009.
Office Action issued in co-pending U.S. Appl. No. 13/172,248, filed Jun. 29, 2011.
Official Action issued Aug. 22, 2013, in counterpart Korean Patent Application No. 10-2012-0069913.
Chi, C.C. et al, "Post-Bond Testing of 2.5D-SICs and 3D-SICs Containing a Passive Silicon Interposer Base", 2011 EEE International Test Conference, Paper 17.3, Sep. 2011, pp. 1-10.
Sun, X. et al., "Electrical modeling, simulation and SPICE model extraction of TSVs in Silicon Interposer", 2011 IEEE 13th Electronics Packaging Technology Conference, Dec. 2011, 4 pages.
Official Action issued Oct. 6, 2014 in counterpart Taiwan Patent Application No. 10321388890.

\* cited by examiner

SYSTEM AND METHOD FOR MODELING THROUGH SILICON VIA

FIELD

The disclosed subject matter relates to modeling and simulation tools for integrated circuits.

BACKGROUND

Integrated circuits ("ICs") are incorporated into many electronic devices. IC packaging has evolved, such that multiple ICs may be vertically stacked in so-called three-dimensional ("3D") packages in order to save horizontal area on a printed circuit board ("PCB"). An alternative packaging technique, referred to as a 2.5D package may use an interposer, which may be formed from a semiconductor material such as silicon, for coupling one or more dies to a PCB. A plurality of IC chips, which may be of heterogeneous technologies, are mounted on the interposer. Connections among the various ICs are routed through conductive patterns in the interposer. Interposers affect the operating characteristics of the ICs that are bonded or otherwise coupled to the interposer due to the resistance and capacitance ("RC") of the semiconductor substrate.

Both 2.5D and 3D IC packages include the use of through substrate vias (TSV), also referred to as through-silicon-vias, in the case of silicon-based dies. The inclusion of TSV increases the complexity of semiconductor fabrication and packaging.

DETAILED DESCRIPTION

Figure 1:
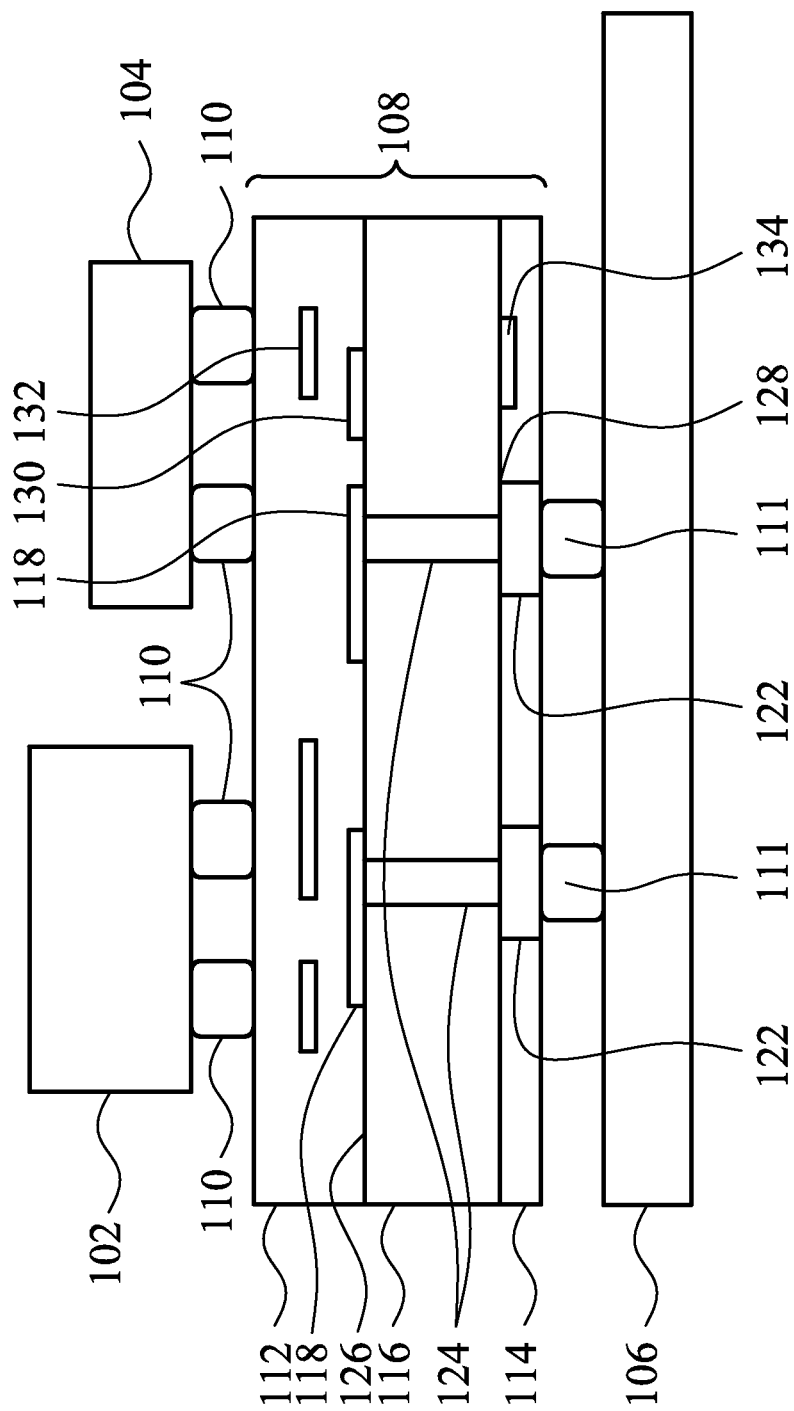
FIG. 1 is a diagram of a 2.5D IC having a semiconductor interposer.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A tool and method are provided for modeling and simulating the frequency dependent capacitive couplings of the semiconductor interposer and inductive couplings of through silicon vias prior to, and during, the design stage. This model is suitable for characterization of new technologies, such as smaller geometry technology nodes, new materials, new processes or the like.

For example, FIG. 1 illustrates one example of a 2.5-dimensional ("2.5D") integrated circuit ("IC") package 100 in which first and second IC chips 102, 104 are coupled to an interposer 108, which is in turn mounted on a package substrate 106. IC chips 102, 104 may be bonded to interposer 108 using small conductive bumps 110, which may be referred to as a "microbump" or "g-bump". Conductive bumps 111 may also be used to couple interposer 108 to package substrate 106. Microbumps 110 connecting the IC chips 102, 104 to interposer 108 may have different sizes and electrical properties than the bumps 111 connecting the interposer 108 to PCB 106.

Interposer 108 includes a semiconductor substrate 116 having front-side and back-side interconnect layers 112, 114 formed on its front and back major surfaces, respectively. In some applications, substrate 116 is not grounded and thus is electrically floating. Front- and back-side interconnect layers 112, 114 each may comprise a plurality of inter-metal dielectric (IMD) layers, which include via level layers (V1, V2, etc.) and metal line level layers (e.g., M1, M2, etc.). As shown in FIG. 1, front-side interconnect structure 112 may include conductors 118, 130 disposed in a first metal layer (i.e., MD and a conductor 132 disposed in a second metal layer (i.e., M2). Conductor 118 in front-side interconnect layer 112 may be electrically connected to metal conductor 122 in back-side interconnect layer 114 by way of a through-silicon via 124 that extends from front-side surface 126 of semiconductor substrate 116 to rear-side surface 128 of semiconductor substrate 116.

Front- and back-side interconnect layers 112, 114 may also include conductors 130, 132, 134 that are not connected to each other. Although front and rear conductors 130, 132, 134 are not conductively connected to each other, electrical coupling (i.e., capacitive and/or inductive coupling) between conductors 130, 132, and 134 occurs during operation of 2.5D IC 100. Electrical coupling also can occur between conductors in the same side of semiconductor substrate 116. For example, electrical coupling may occur between conductor 118 and 130, even if there is no conductive connection between them. Coupling may also occur between adjacent TSVs 124 that extend through semiconductor substrate 116. The electrical coupling between conductors in the interposer degrades the performance of the 2.5D IC. Typical RC extraction tools and simulation software based on the outputs of such RC extraction tools do not model the frequency dependent effects of such capacitive or inductive couplings. Thus, the interposer of 2.5D ICs designed using such tools thus have different frequency dependent characteristics than is intended during the design and simulation phase.

Figure 2:
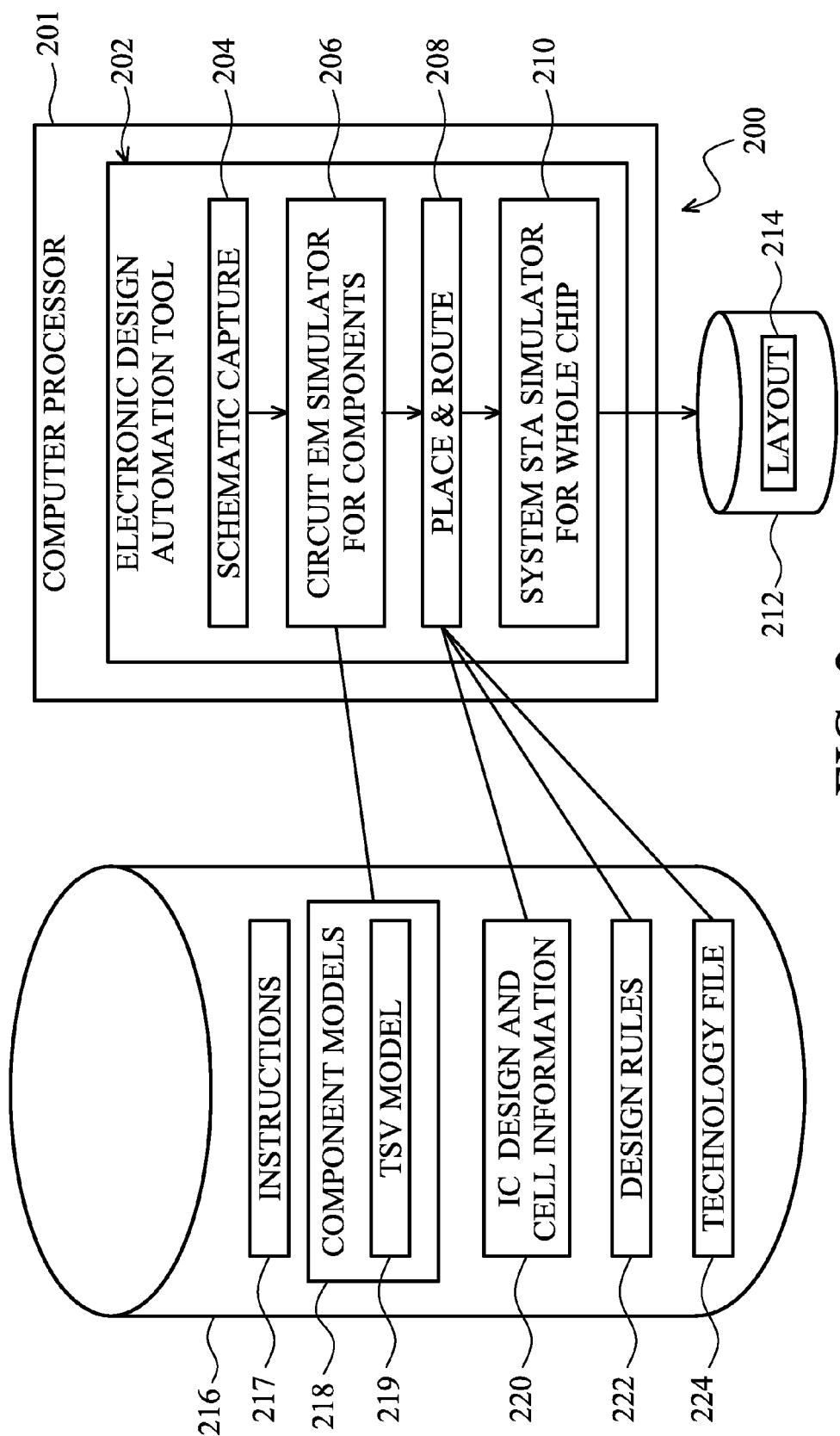
FIG. 2 is a block diagram of a system for modeling the semiconductor interposer of FIG. 1.

FIG. 2 is a block diagram of a system for modeling a semiconductor interposer, according to one embodiment. System 200 includes an electronic design automation ("EDA") tool 202 for analog, radio frequency (RF) and mixed-signal circuits. In some embodiments, system 200 includes a general purpose processor programmed with computer program code that configures the circuits of the processor 201 to function as an EDA tool. Examples of suitable EDA tools include, but are not limited to "ADVANCED DESIGN SYSTEM (ADS)"™, sold by Agilent. of Santa Clara, Calif., which may include a schematic capture tool 204 and a circuit simulator 206 that provides SPICE-level analog and RF simulation. Other EDA tools 302 may be used, such as the "CADENCE® VIRTUOSO® SPECTRE®" circuit simulator. sold by Cadence Design Systems, Inc. of San Jose, Calif. The processor 201 is programmed to run the tool to analyze a circuit to determine a response of the circuit to an input RF signal, for at least one of designing, manufacturing, and testing the circuit.

In other embodiments, the EDA tool may be implemented in special purpose hardware including application specific integrated circuitry, for example.

EDA tool 202 is a special purpose computer formed by retrieving stored program instructions 217 from a non-transient computer readable storage medium 216 and executing the instructions on a general purpose processor 201. Examples of persistent, non-transient computer readable storage mediums 216 include, but are not limited to, read only memories ("ROMs"), random access memories ("RAMs"), flash memories, or the like. Tangible, non-transient machine readable storage mediums 212, 216 are configured to store inputs 220, 222 and 224 used by the EDA tool 202 and layout data 214 generated by the place and route tool 208.

In addition, the medium 212, 216 can store component models 218, such as a through substrate via (TSV) model 219 used during characterization. The component models may include frequency-dependent circuit models that approximate the semiconductor's response to wideband electromagnetic signals.

Although FIG. 2 shows an example with two machine readable media 212, 216, any positive integer number of media may be used. Although FIG. 2 shows data schematically organized in certain blocks, these blocks do not map to a limited single physical arrangement on the media 212, 216. The data may be organized in one or more files and formats, according to the data structures used by the EDA tool.

EDA tool 202 also includes an electromagnetic ("EM") simulation tool 210. EM simulation tool 210 is used during characterization.

Place and route tool 208 is capable of receiving an identification of a plurality of cells to be included in an integrated circuit ("IC") or interposer layout, including a netlist of pairs of cells within the plurality of cells to be connected to each other. Place and route tool 208 may be equipped to use a set of default design rules 220 as well as foundry specific and/or technology node specific parameters included in a tech file 224. The resulting design can later be fed-in to a static timing analysis (STA) tool 210, which can include simulation by Eletromagnetic tool (RLC) or layout parasitic extraction (LPE) tool (RC). In some embodiments, the LPE tool is "StarRC" by Synopsys of Mountain view, CA and "CALIBRE"® by Mentor Graphics of Wilsonville, Oregon. In some embodiments, the EM tool, is Ansoft HFSS by ANSYS of Canonsburg, Pennsylvania, or EMDS-for-ADS, by Agilent of Santa Clara, California.

Referring again to FIG. 2, the STA simulator 210 receives the combined model and performs a simulation, which can now account for the frequency dependent characteristics of the interposer substrate 116. Some users may choose to use the tools only on RC calculation. Such a user can use the LPE extraction tool by itself, to calculate the parasitics existing in the metal routings. If interconnect with RLC is required, then the user uses the Electro-Magnetic simulation tool to extract the interconnect.

Figure 3:
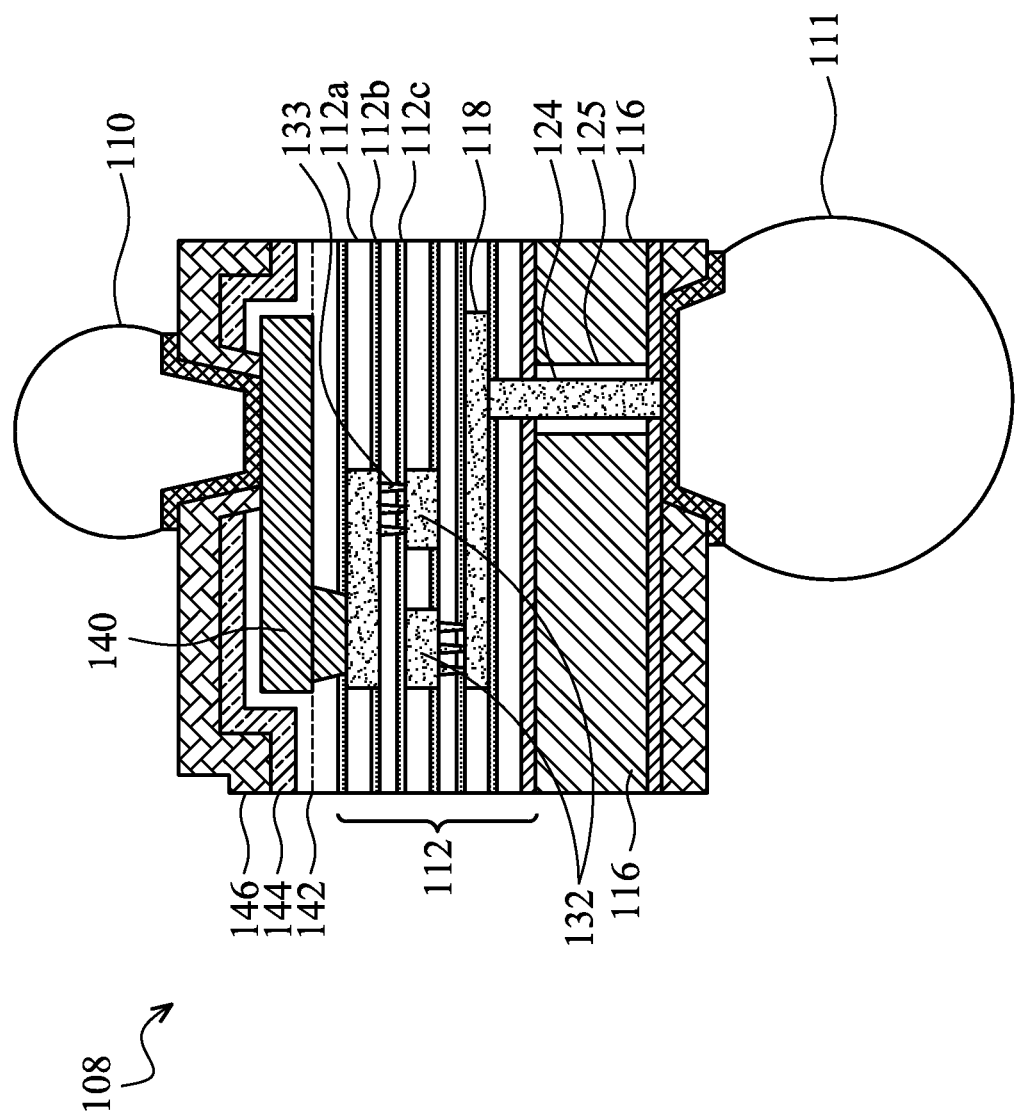
FIG. 3 is a detailed diagram of a through substrate via in the semiconductor interposer of FIG. 1.

FIG. 3 shows a more detailed view of the portion of the interposer 108 including the TSV 124. The interposer 108 has a substrate 116 which may be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments.

The substrate has an interconnect structure comprising a plurality of interconnect layers 112a-112c formed over the substrate. The interconnect layers 112a-112c may be formed of the same materials used for integrated circuit back end of line (BEOL) processing. These include dielectric layers 112a, passivation layers 112b, and etch stop layers 112c. Dielectric layers dielectric layer 112a may be silicon nitride, silicon oxide, silicon dioxide, silicon oxynitride, low-k dielectric, or ELK material. In one embodiment, the interposer substrate 116 is silicon, the dielectric 116a is undoped silicate glass (USG), the passivation layers 112b are silicon nitride, and the etch stop layers 112c are silicon carbide.

A plurality of conductive patterns 132 (such as copper line patterns) are formed in the line layers of the interconnect structure 112. The line patterns in different levels are connected to each other by conductive vias 133. Above the top metal layer of the interconnect structure 112, some embodiments include a redistribution layer 140. The purpose for redistribution layer (RDL) is to connect between dies with PAD and probing. In some embodiments, the RDL also is used for interconnection, since the RDL has lower resistance than inter-metal (line and via) connections in the lower layers. In other embodiments, the RDL is used for fan out.

The interposer model 500 is tangibly embodied in a non-transitory machine readable storage medium to be accessed by the processor 201. The interposer model is processed by the computer 201 to output data representing a response of a TSV 124 to the radio frequency (RF) signal.

Figure 5A:
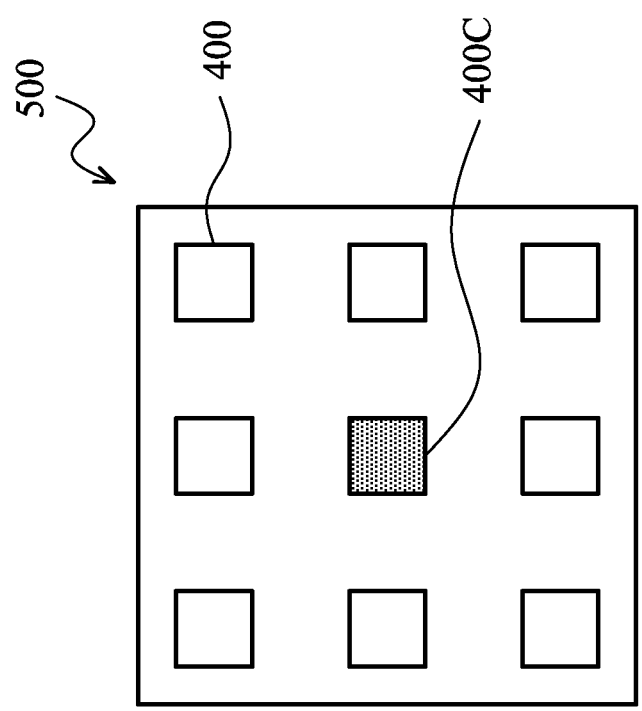
FIG. 5A is an example of a TSV surrounded by eight grounded TSVs.
Figure 5B:
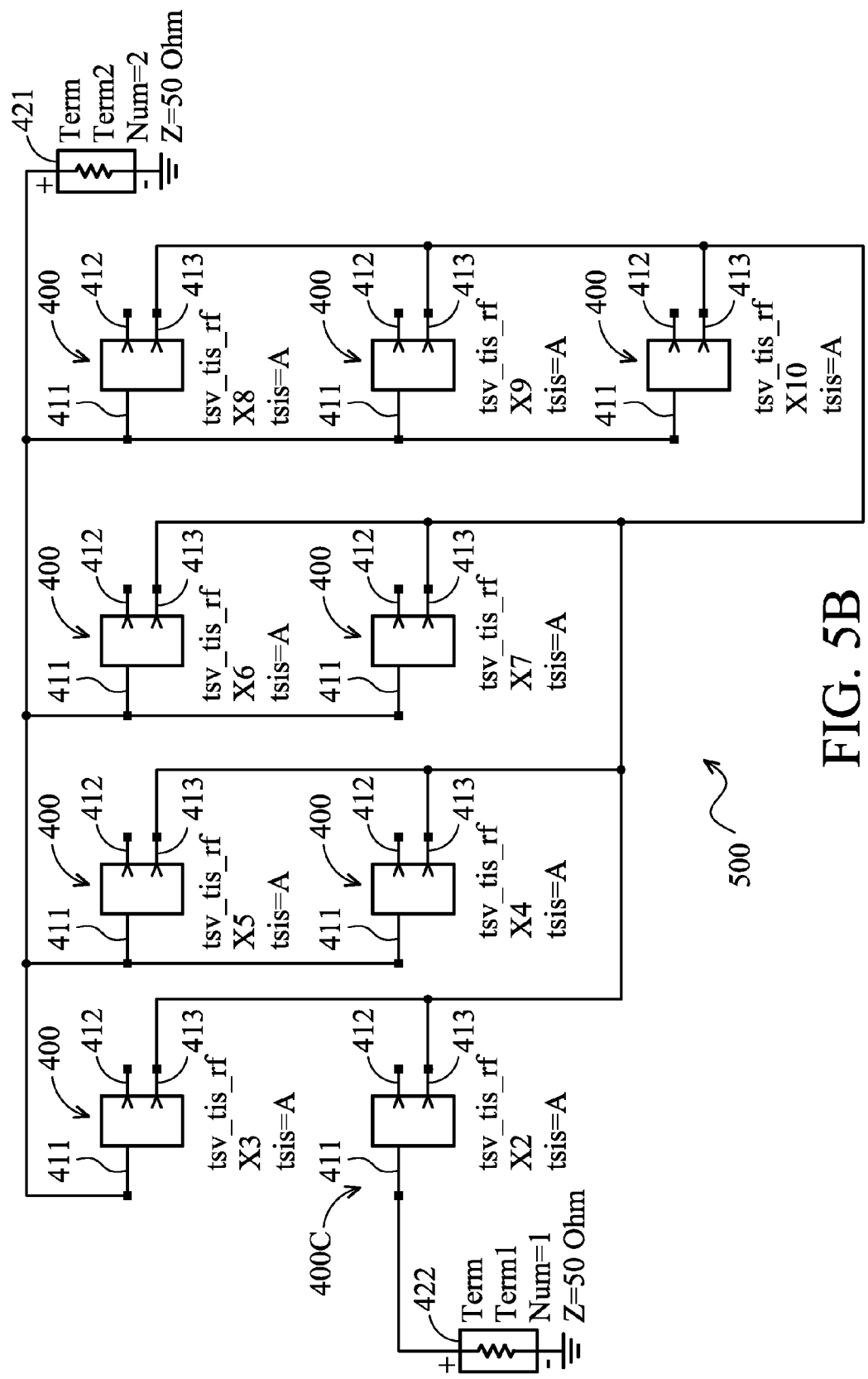
FIG. 5B is a schematic diagram of a model of an interposer having the TSV configuration of FIG. 5A.

An exemplary interposer model 500 is shown in FIGS. 5A and 5B. The interposer model can be configured to represent any desired arrangement of TSVs. For example FIG. 5A shows a configuration 500 including a central TSV 400C surrounded by eight grounded TSVs 400. This basic configuration can be modeled to evaluate the impact of the TSV-to-TSV distance. FIG. 5B schematically shows a model of the TSV configuration of FIG. 5A. In this example, it is assumed there is a sufficiently large space between the TSVs 400 and any other TSVs, conductive patterns or vias (not shown) so that any other TSVs, patterns or vias can be neglected.

In FIG. 5B, the interposer model 500 has a plurality of TSV models 400 representing the grounded TSVs. Each TSV model 400 has a respective three-port network. The first port 411 of each three-port network is connected to a node 421 having a first potential, such as ground or Vss. The second port 412 of each three-port network is open, unconnected to any signal. The third port 413 of each three-port network is a floating node (where a floating node is a model/schematic internal node). The floating nodes 413 of each of the three-port networks are connected to each other, but not to any external nodes. The central TSV 400C has its first port 411 connected to a node 422 having a second potential. The second port 412 of TSV 400C is open, unconnected to any signal. The third port 413 of TSV 400C is a floating node, and is connected to the floating nodes of all the other TSVs. FIG. 5B is just one example of a study on floating nodes, which are to be connected together when placing into the schematics, and a study for TSV to TSV couplings. In some embodiments, node 412 will be connected to the interconnect routings by way of vias and/or conductive lines.

Figure 4:
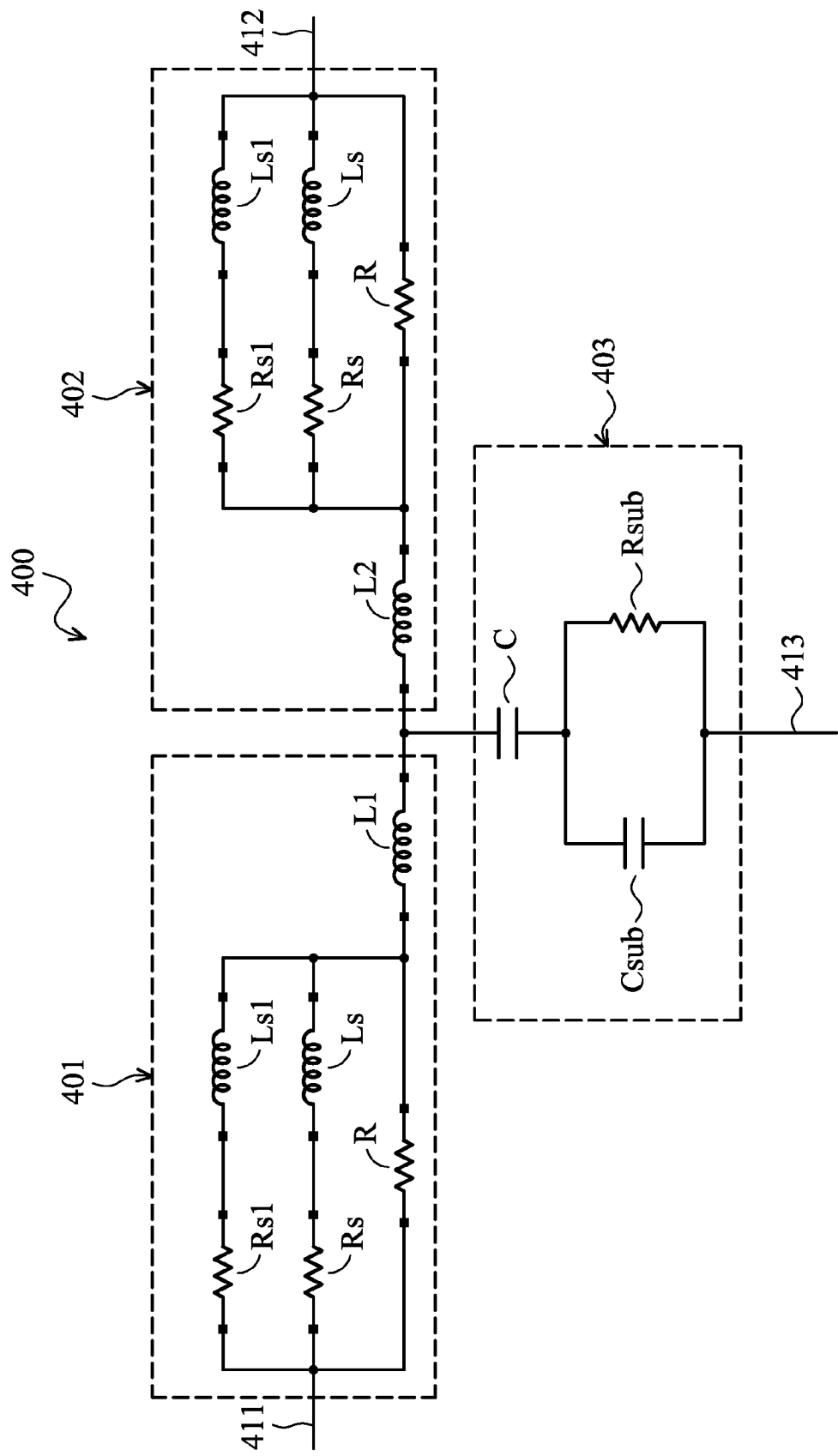
FIG. 4 is a schematic diagram of a TSV model implemented in the computer of FIG. 2.

FIG. 4 is a schematic diagram of a model 400 of a single TSV 124 (FIG. 3) as modeled using discrete components. In some embodiments, each of the models 400 in FIG. 5B is configured according to the schematic of FIG. 4.

As shown in FIG. 4, each three port network 400 includes: a capacitive components 403 connected to the floating node 413, and first and second inductive components 401, 402 connected to the capacitive component 403. The inductive components 401, 402 represent discrete inductors located along a central longitudinal axis of the TSV 124, and the capacitive component represents a discrete capacitor extending outward in the radial direction from the center of the TSV. The inductive components 401, 402 and capacitive component 403 are connected in a "T" configuration.

The capacitive component 403 includes a fixed capacitance component C representing a capacitance of a TSV liner layer 125 and variable input components Csub, Rsub, representing a capacitance of the interposer and a resistance of the interposer, respectively. The capacitance C is fixed, because the liner layer 125 of each TSV 124 is substantially identical. The capacitance Csub and Resistance Rsub are variable to allow the capacitance Csub and resistance Rsub of the interposer substrate 116 to be varied during modeling to represent varied distance between adjacent TSVs. The TSV models 400 are scalable to represent different distances between adjacent TSVs by adjusting the input components Csub, representing the capacitance, and Rsub representing the resistance of the interposer. For example, in a model 500 having a TSV surrounded by grounded TSVs, as shown in FIG. 5, the effect of TSV-to-TSV distance can be characterized by varying Csub and Rsub. In some embodiments, the fixed capacitance C is in series with the variable capacitance Csub and resistance Rsub, and Csub and Rsub are in parallel with each other.

Each of the first and second inductive components 401, 402 includes at least two inductors having different inductances from each other. In one embodiment, the at least two inductors include inductors Ls and Ls1 connected in parallel to each other. In some embodiments, the at least two inductors include inductors Ls and L1 connected in series with each other. In some embodiments, the at least two inductors include: first and second inductors Ls and Ls1 connected in parallel to each other; and a third inductor L1 (or L2) in series with the first and second inductors Ls, Ls1. The third inductor L1 (or L2) has a different inductance than at least one of the first and second inductors.

The first and second resistors and inductors Rs, Rs1, Ls, Ls1 of the first inductive component 401 represent resistance and inductance of a circuit element (e.g., landing pad for the TSV on a first side of the interposer substrate 116). The first and second resistors and inductors Rs1, Rs, Ls1, Ls of the second inductive component 402 represent resistance and inductance of a circuit element on a second side of the interposer 116 opposite the first side. The third inductor L1 (L2) of the first (second) inductive component 401 (402) represents a self-inductance of the top (bottom) half of the TSV.

As shown in FIG. 4, the inductive component 401 (402) has a parallel network with three parallel circuit paths: the first path includes a fixed inductor R in series with a fixed inductor L1 (L2). In parallel with the fixed resistor R are first and second circuit paths, the first circuit path having a first tunable resistance Rs and first tunable inductance Ls, and the second path having a second tunable resistance Rs1 and second tunable inductance Ls1. In some embodiments, the values of the components of inductive component 401 are the same as the values of the components of the inductive component 402. In other embodiments, the values of any of the R, L1, Rs, Ls, Rs1 and Ls1 in inductive component 401 may differ from the corresponding value of R, L2, Rs, Ls, Rs1 and/or Ls1 of the inductive component 402, to more accurately model any asymmetry in the TSV configuration. For example, if the cross-sectional dimension of the TSV is greater near one surface of the interposer and smaller near the other surface of the interposer, this asymmetry can be modeled by adjusting one or more of the parameters of either or both inductive components 401, 402.

Figure 6A:
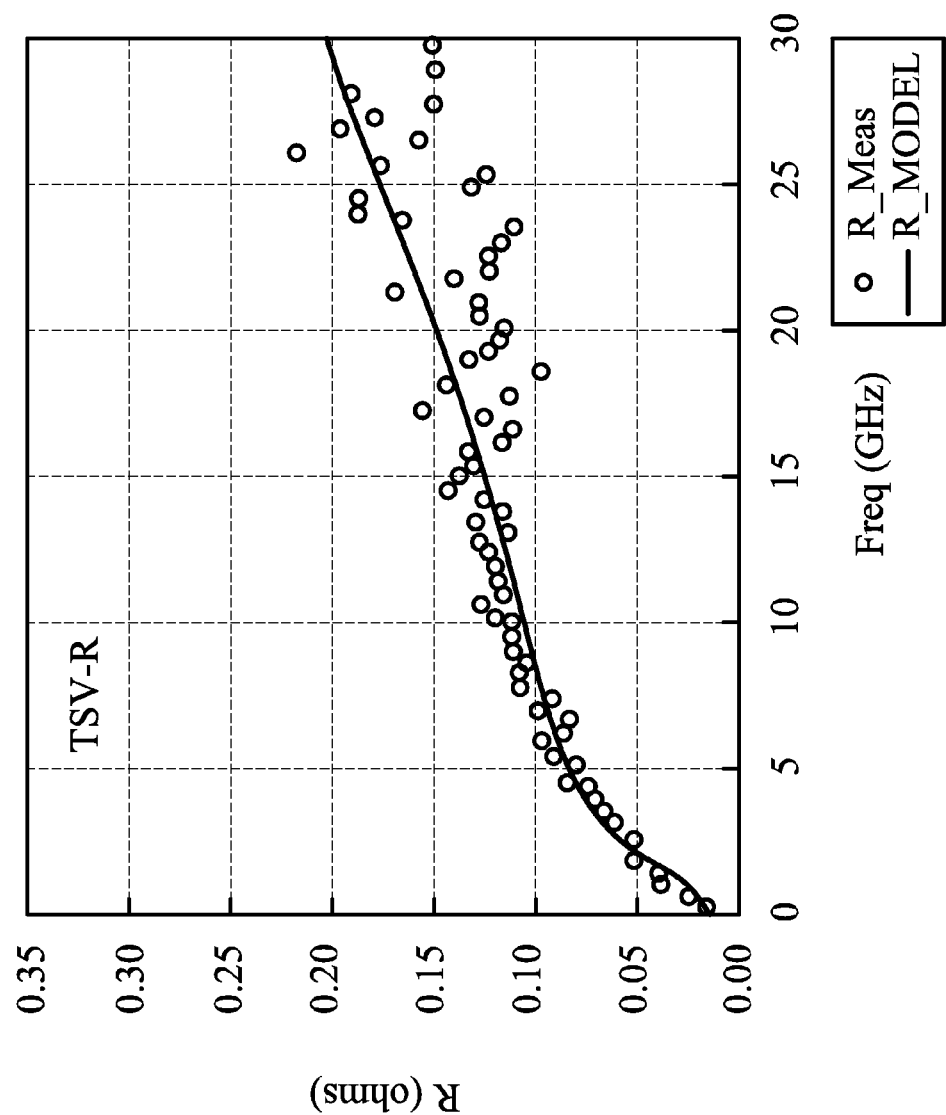
FIGS. 6A-6C are diagrams comparing experimentally measured resistance, inductance and capacitance to respective values computed by the model.
Figure 6B:
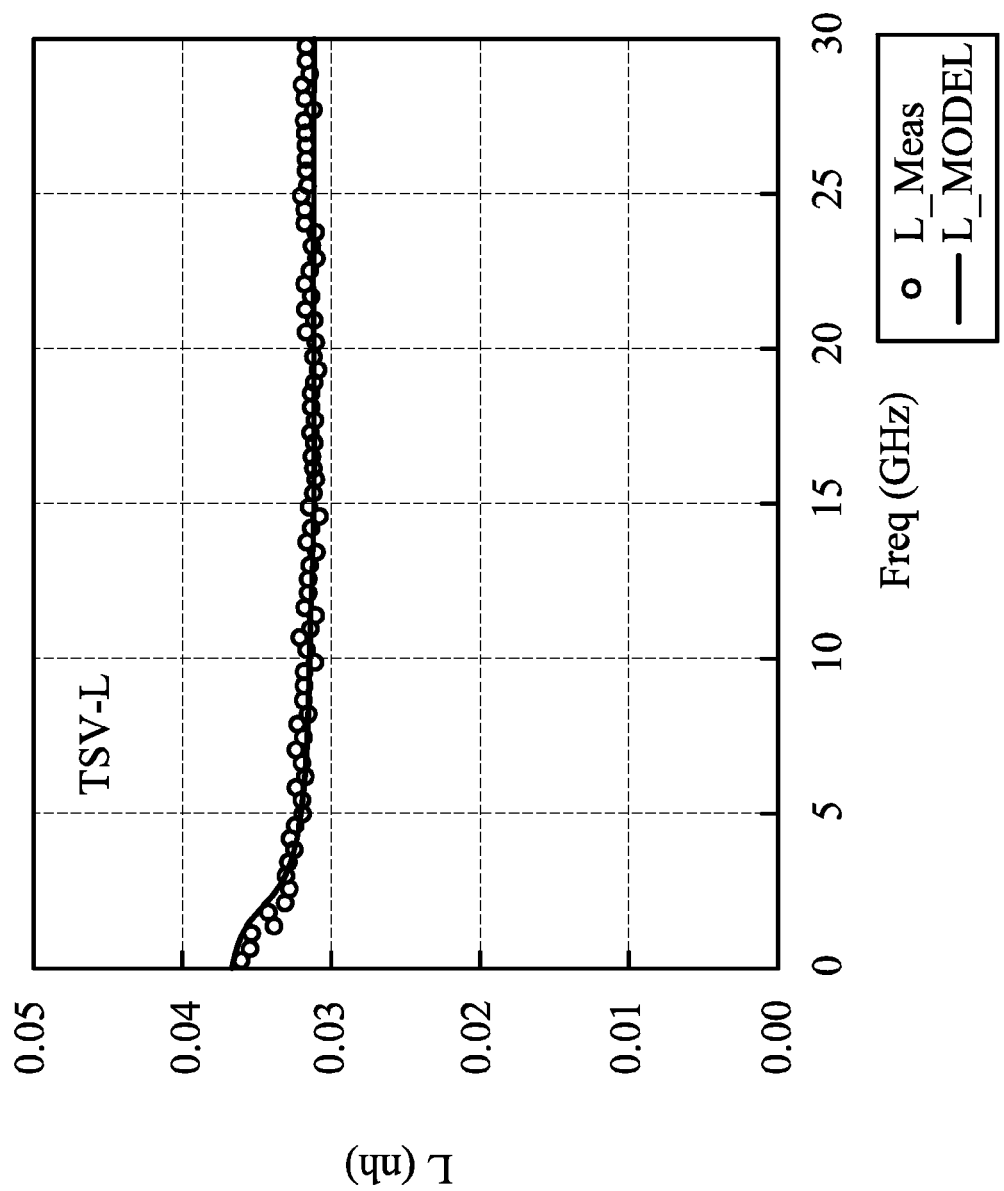
Figure 6C:
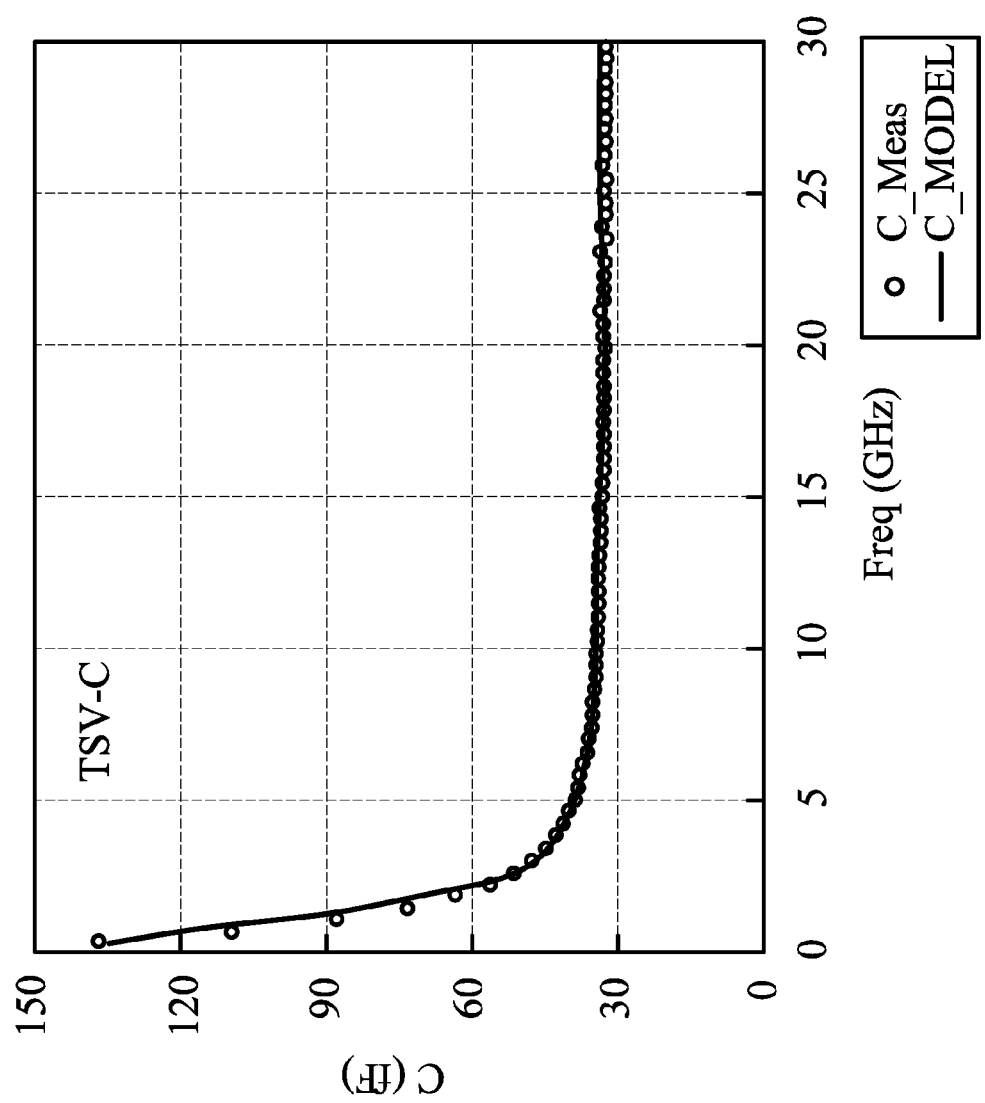

The tunable parameters Rs, Ls, Rs1 and Ls1 permit the model 400 to be tuned to provide a response to signal inputs that tracks the characteristics of an actual TSV over a wide range of frequencies. The resistance, capacitance and inductance of a TSV are not constant over a wide band of frequencies extending into the extremely high frequency (EHF) band of 30-300 Ghz. For example, FIGS. 6A-6C show test data for the resistance, inductance, and capacitance of a TSV across a range of frequencies between 0 and 30 GHz. The circles represent data points collected in silicon tests. The solid lines show the values predicted by the models of FIGS. 4, 5A and 5B. The real impedance predicted by the model fit the experimental data within 10%. Similarly, the model predicts the transmission coefficient $S_{21}$ with similar accuracy. In other embodiments, the parameters Rs, Ls, Rs1 and Ls1 are tuned so that the model closely tracks performance of the TSV model throughout a simulation range from 100 MHz to 100 GHz, when the model is analyzed throughout that range by the EDA tool.

In addition, the tuning parameters may be adjusted to reflect variations in TSV inductance and capacitance as a function of operating temperature.

In addition to characterizing the effects of the TSV-to-TSV distance, this model may be used to characterize other parameters of the interposer layout and fabrication process. For example, The resistances Rs and Rs1 and the inductances Ls and Ls1 can also be varied to correspond to different dimensions of the TSV itself. Also, the capacitance C can be varied to characterize the impact of variations in liner thickness. Further, the model of FIGS. 5A and 5B can be varied, to add passive components, such as metal lines and transmission lines.

Other arrangements and configurations of grounded TSVs or voltage bias TSVs around a TSV can be similarly characterized, by varying the arrangement of FIG. 5B. For example, any number of grounded TSVs or voltage biased TSVs can be used. Where voltage biased TSV without AC signal is taken as AC ground, technically. The inventors have found that, as the number of nearby grounded TSVs surrounding a TSV being modeled grows larger, the total parasitic capacitance approaches the capacitance C representing the capacitance of the liner layer. For relatively smaller numbers of surrounding grounded TSVs, the total parasitic capacitance was found to vary approximately as:

$$Cap_{(tsv\text{-}to\text{-}tsv)} \sim \frac{N}{N+1} Cap_{(one\_tsv)}$$

where Cap(tsv-to-tsv) is the capacitance between two TSVs, Cap(one_tsv) is the liner capacitance, and N is the number of surrounding grounded capacitors.

Figure 7:
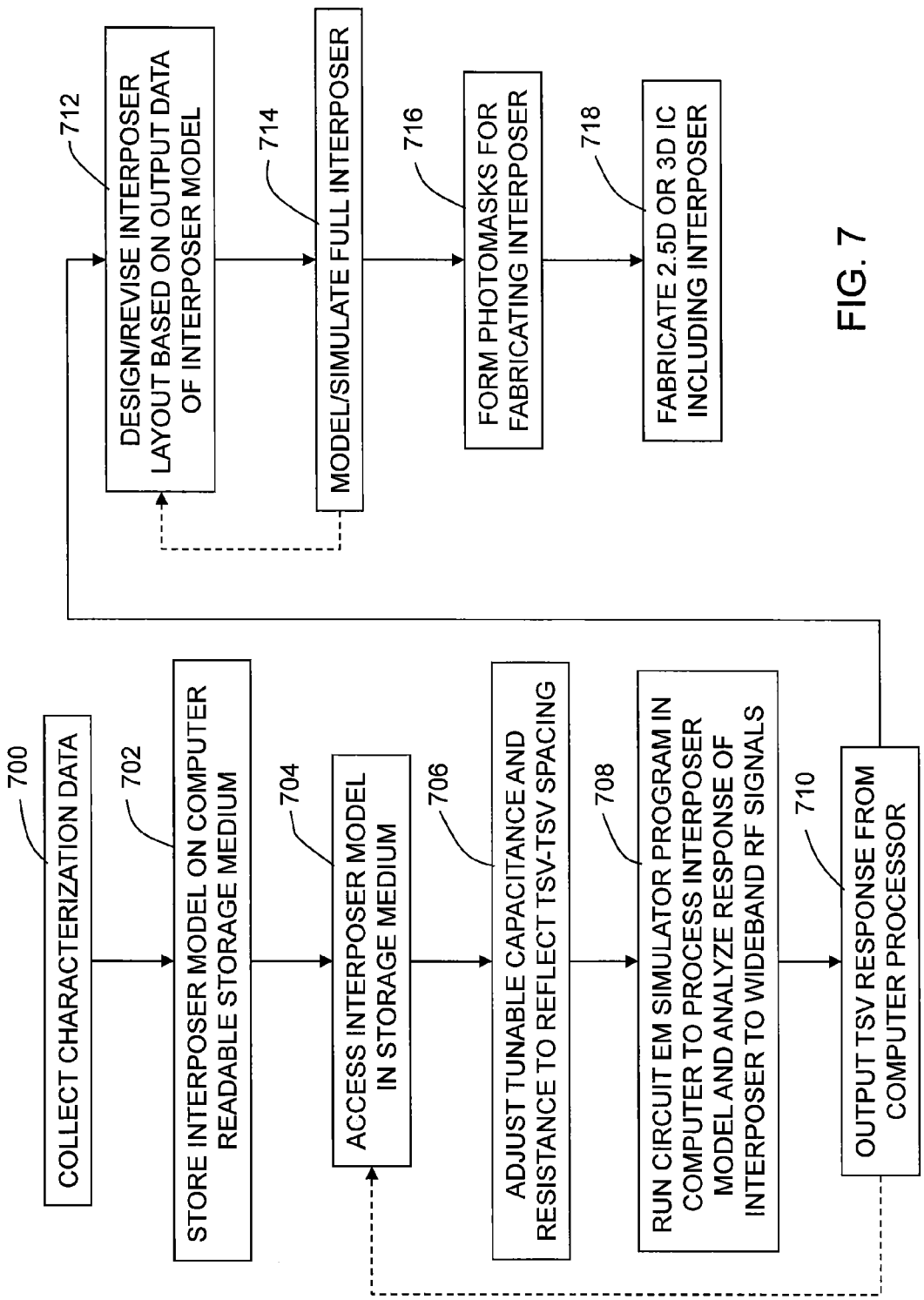
FIG. 7 is a flow chart of a method for characterizing a TSV.

FIG. 7 is a flow chart of a computer implemented method for modeling the TSV.

At step 700, characterization data are collected. For example, a design of experiment may include fabricating a sample of silicon interposers having respectively different TSV-to-TSV distances, and testing the TSV's using a network analyzer, to measure the resistance, capacitance and inductance of the TSV throughout the band from 100 Mhz to 100 Gzhz. In some embodiments, the characterization data are collected at more than one different distance between adjacent TSVs, and at more than one temperature. In some embodiments, step 700 is performed only once for a new technology, and the model can subsequently be used to predict the RF performance of the TSV by scaling the tuning parameters.

At step 702, the interposer model is stored on a tangible, non-transitory machine readable storage medium (e.g., a computer readable storage medium). The model may include a netlist defining the devices and connections within the TSV model as shown in FIG. 4, and a set of values for each fixed resistor, capacitor and inductor in the model. The model may further include a netlist defining the plurality of TSVs in the interposer, as shown in FIG. 5B. The interposer model has a plurality of through substrate via (TSV) models, each TSV model having a respective three-port network, one of the ports of each three-port network being a floating node, the floating nodes of each of the three-port networks connected to each other.

At step 704, the interposer model stored in the medium is accessed by a programmed processor. In some embodiments, the processor retrieves a netlist defining the arrangement of discrete devices in the model, and the values of each fixed value device.

At step 706, the tunable capacitance and resistance are adjusted to reflect at least one TSV-to-TSV spacing. In some embodiments, a script program automatically repeats a loop in which different values are generated for each tunable input value and provided to the processor, each time step 706 is performed. In other embodiments, a user enters one or more values for one of the tunable inputs.

At step 708, the processor runs the circuit EM simulator program to process the interposer model. The processor is programmed to analyze the discrete circuit representation of the TSV model to determine a response of the TSV circuit to an input radio frequency (RF) signal for at least one of designing, manufacturing, and testing the circuit.

At step 710, the processor outputs data representing a response of a TSV to the radio frequency (RF) signal. The output may be in a variety of formats. For example, the outputs may include storing in a persistent tangible computer readable storage medium, displaying or printing the results in tabular or graphical format. The output data may include, for example, TSV resistance, inductance, capacitance, and $S_{21}$ magnitude and phase, as a function of frequency. The outputs may also show the variation in any of these parameters as a function of the TSV-to-TSV distance.

Steps 704 to 710 may be repeated any desired number of times, either under control of a program or script, or under manual control by a user.

At step 712, an interposer layout is designed or modified, based on the output data from the interposer model.

At step 714, the full interposer layout configuration is modeled or simulated. For example, if the interposer layout has a different TSV arrangement than the 3×3 model of FIG. 5 used during characterization, another model of the interposer configuration may be used. Further, other nodes of the interposer pertinent to RF performance may be included in this model.

Steps 712 and 714 may be repeated any desired number of times, until the designer's specifications are satisfied.

At step 716, the final interposer design is taped out, and photomasks are formed for fabricating the interposer having the interposer configuration.

At step 718, a 2.5D IC or 3D IC including the interposer configuration is fabricated.

The example shown and described above includes an interposer with a TSV extending through the interposer. In some embodiments, a plurality of dies are arranged directly on the interposer, in a so-called 2.5D IC configuration. In other embodiments, a stack of dies may be interconnected on the interposer in a 3D IC configuration.

In some embodiments, a computer implemented system comprises a processor programmed to analyze a circuit to determine a response of the circuit to an input radio frequency (RF) signal, for at least one of designing, manufacturing, and testing the circuit. An interposer model is tangibly embodied in a non-transitory machine readable storage medium to be accessed by the processor. The interposer model is processed by the computer to output data representing a response of a through substrate via (TSV) to the radio frequency (RF) signal. The interposer model comprises a plurality of TSV models. Each TSV model has a respective three-port network. One of the ports of each three-port network is a floating node. The floating nodes of each of the three-port networks are connected to each other.

In some embodiments, a computer implemented method comprises: accessing an interposer model stored in a tangible, non-transitory machine readable storage medium, the interposer model comprising a plurality of through substrate via (TSV) models, each TSV model having a respective three-port network, one of the ports of each three-port network being a floating node, the floating nodes of each of the three-port networks connected to each other; processing the interposer model in a computer processor, wherein the processor is programmed to analyze a circuit to determine a response of the circuit to an input radio frequency (RF) signal for at least one of designing, manufacturing, and testing the circuit; and outputting from the processor data representing a response of a TSV to the radio frequency (RF) signal.

In some embodiments, a persistent, tangible machine readable storage medium encoded with data. The data represent an interposer model. The interposer model is accessed and processed by a computer to output data representing a response of a through substrate via (TSV) to a radio frequency (RF) signal. The interposer model comprises a plurality of TSV models. Each TSV model has data representing a respective three-port network. One of the ports of each three-port network is a floating node. The floating nodes of each of the three-port networks are connected to each other. The model is accessible by a processor programmed to analyze a circuit including at least one TSV, to determine a response of the circuit to an input radio frequency (RF) signal, for at least one of designing, manufacturing, and testing the circuit.

The methods and system described herein may be at least partially embodied in the form of computer-implemented processes and apparatus for practicing those processes. The disclosed methods may also be at least partially embodied in the form of tangible, non-transient machine readable storage media encoded with computer program code 119. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that the computer becomes a special purpose apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A computer implemented system for analyzing an interposer model, comprising:
    an electronic design automation (EDA) tool configured to run a circuit electromagnetic (EM) simulator program for analyzing a circuit to determine a response of the circuit to an input radio frequency (RF) signal across a range of frequencies extending from 30 GHz to 100 GHz, for at least one of designing, manufacturing, and testing the circuit, and for generating an output based on a result of the analyzing, for fabricating a photomask for patterning the circuit; and
    a non-transitory machine readable storage medium accessed by the processor, the non-transitory machine readable storage medium encoded with data representing an interposer model, the interposer model comprising a plurality of through substrate via models, each through substrate via model representing a respective through substrate via within an interposer as a circuit, wherein the interposer model is processed by the circuit EM simulator program and runs in the processor to output data representing a response of a through substrate via model to the input radio frequency (RF) signal, each through substrate via model having a respective three-port network, one of the ports of each three-port network being a floating node, the floating node of each of the three-port networks connected to each other, wherein each three port network includes first and second inductive components, each of the first and second inductive components including at least two inductors having different inductances from each other.

2. The computer implemented system for analyzing an interposer model of claim 1, wherein each three port network further includes:
    a capacitive component connected to the floating node; and
    the first and second inductive components are connected to the capacitive component.

3. The computer implemented system for analyzing an interposer model of claim 2, wherein the capacitive component includes a fixed capacitance component representing a capacitance of a through substrate via liner layer and variable input components representing a capacitance of the interposer model and a resistance of the interposer.

4. The computer implemented system for analyzing an interposer model of claim 1, wherein the at least two inductors are connected in parallel to each other.

5. The computer implemented system for analyzing an interposer model of claim 1, wherein the at least two inductors are connected in series with each other.

6. The computer implemented system for analyzing an interposer model of claim 1, wherein the at least two inductors include:
    first and second inductors connected in parallel to each other; and
    a third inductor in series with the first and second inductors, the third inductor having a different inductance than at least one of the first and second inductors.

7. The computer implemented system for analyzing an interposer model of claim 6, wherein:
    the capacitive component includes a fixed capacitance component representing a capacitance of a through substrate via liner layer in series with a variable input components representing a capacitance of the interposer and a resistance of the interposer model.

8. The computer implemented system for analyzing an interposer model of claim 6, wherein
    the first and second inductors of the first inductive component represent an inductance of a circuit element on a first side of the interposer model,
    the first and second inductors of the second inductive component represent an inductance of a circuit element on a second side of the interposer opposite the first side, and
    the third inductor represents a self-inductance of the through substrate via.

9. The computer implemented system for analyzing an interposer model of claim 1, wherein each three port network includes:
    a capacitive component connected to the floating node, wherein the capacitive component includes a fixed capacitance component representing a capacitance of a through substrate via liner layer in series with variable input components representing a capacitance of the interposer model and a resistance of the interposer; and
    the first and second inductive components are connected to the capacitive component, each of the first and second inductive components including:
        first and second inductors connected in parallel to each other wherein the first and second inductors of the first inductive component represent an inductance of a circuit element on a first side of the interposer model, and the first and second inductors of the second inductive component represent an inductance of a circuit element on a second side of the interposer opposite the first side; and
        a third inductor in series with the first and second inductors, the third inductor having a different inductance than at least one of the first and second inductors, the third inductor representing a self-inductance of the through substrate via.

10. The computer implemented system for analyzing an interposer model of claim 9, wherein:
    each of the first and second inductive components includes a first resistor in series with the first inductor, a second resistor in series with the second inductor and a third resistor in parallel with the first and second inductors, the third resistor connected in series with the third inductor.

11. A computer implemented method for analyzing an interposer model comprising:

accessing an interposer model stored in a tangible, nontransitory machine readable storage medium, the interposer model comprising a plurality of through substrate via models, each through substrate via model representing a through substrate via as a circuit having a respective three-port network, one of the ports of each three-port network being a floating node, the floating nodes of each of the three-port networks connected to each other, wherein each three port network includes first and second inductive components, each of the first and second inductive components including at least two inductors having different inductances from each other;

running a circuit simulator program in an electronic design automation (EDA) tool, the circuit simulator program processing the interposer model, wherein the computer processor is programmed with the circuit simulator program to analyze the interposer model, to determine a response of the interposer model to an input radio frequency (RF) signal across a range of frequencies extending from 30 GHz to 100 GHz;

outputting from the processor data representing a response of a through substrate via model to the input radio frequency (RF) signal;

providing an interposer layout configuration based on the output data; and forming a set of photomasks for fabricating an interposer having the interposer layout configuration.

12. The computer implemented method for analyzing an interposer model of claim 11, further comprising:

providing an interposer layout configuration based on the output data; and fabricating a 2.5 dimensional integrated circuit or 3 dimensional integrated circuit including the interposer layout configuration.

13. The computer implemented method for analyzing an interposer model of claim 11, wherein each three port network further includes:

a capacitive component connected to the floating node; and the first and second inductive components are connected to the capacitive component.

14. The computer implemented method for analyzing an interposer model of claim 13, wherein the capacitive component includes a fixed capacitance component representing a capacitance of a through substrate via liner layer and variable input components representing a capacitance of the interposer and a resistance of the interposer, and the through substrate via models are scalable to represent different distances between adjacent through substrate vias by adjusting the input components representing the capacitance and resistance of the interposer.

15. The computer implemented method for analyzing an interposer model of claim 13, wherein each of the first and second inductive components includes at least two inductors having different inductances from each other.

16. The computer implemented method for analyzing an interposer model of claim 11, wherein the processing includes simulating performance of the through substrate via model throughout a range from 100 MHz to 100 GHz.

17. A persistent, tangible machine readable storage medium encoded with instructions run by a computer for analyzing a circuit and data processed by the instructions, wherein, the instructions in the persistent, tangible machine readable storage medium, when executed by the computer, cause the computer to operate as an electronic design automation (EDA) tool configured to run a circuit simulator program;

the data representing an interposer model, the interposer model accessed and processed by the circuit simulator program running in the computer to output data representing a response of a through substrate via model to a radio frequency (RF) signal across a range of frequencies extending from 30 GHz to 100 GHz, the interposer model comprising a plurality of through substrate via models, each through substrate via model representing a through substrate via within an interposer as a circuit, each through substrate via model having data representing a respective three-port network, one of the ports of each three-port network being a floating node, the floating node of each of the three-port networks connected to each other, wherein each three port network includes first and second inductive components, each of the first and second inductive components including at least two inductors having different inductances from each other;

the interposer model being accessible by the computer programmed with the circuit simulator program to analyze the interposer model including the through substrate via models, to determine a response of the interposer to an input radio frequency (RF) signal across the range of frequencies extending from 30 GHz to 100 GHz.

18. The persistent, tangible machine readable storage medium encoded with instructions executed by a computer for analyzing a circuit and data processed by the instructions of claim 17, wherein each three port network includes:

a capacitive component connected to the floating node, including:

a fixed capacitance component representing a capacitance of a through substrate via liner layer and a variable input components representing a capacitance of the interposer model and a resistance of the interposer model; and wherein the first and second inductive components each include:

first and second inductors connected in parallel to each other; and a third inductor in series with the first and second inductors, the third inductor having a different inductance than at least one of the first and second inductors.

* * * * *